(12) United States Patent
Bodano et al.

(10) Patent No.: US 10,707,840 B2
(45) Date of Patent: Jul. 7, 2020

(54) POWER STAGE WITH SEQUENTIAL POWER TRANSISTOR GATE CHARGING

(71) Applicant: Infineon Technologies AG, Neubiberg (DE)

(72) Inventors: Emanuele Bodano, Villach (AT); Vratislav Michal, Villach (AT); Joachim Pichler, Landskron (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/142,699

(22) Filed: Sep. 26, 2018

(65) Prior Publication Data

US 2020/0099367 A1    Mar. 26, 2020

(51) Int. Cl.
| | | |
|---|---|---|
| *H02M 3/07* | (2006.01) | |
| *H03K 3/012* | (2006.01) | |
| *H03K 17/041* | (2006.01) | |

(52) U.S. Cl.
CPC .............. *H03K 3/012* (2013.01); *H02M 3/07* (2013.01); *H03K 17/04106* (2013.01); *H03K 2217/0063* (2013.01)

(58) Field of Classification Search
CPC ....... H02M 3/07; H02M 3/1582; H03K 3/102
See application file for complete search history.

(56) References Cited

U.S. PATENT DOCUMENTS

| | | | | | |
|---|---|---|---|---|---|
| 5,914,589 | A | * | 6/1999 | Erckert | H03K 17/063 323/282 |
| 6,812,782 | B2 | * | 11/2004 | Grant | H02M 3/1588 323/282 |
| 8,558,586 | B1 | * | 10/2013 | Martin | G11C 7/1057 327/108 |
| 8,872,496 | B2 | * | 10/2014 | Miyamae | G05F 1/46 323/285 |
| 9,112,494 | B2 | * | 8/2015 | Kartal | H03K 17/063 |
| 9,231,583 | B2 | * | 1/2016 | Hoyerby | H02M 1/08 |
| 9,490,697 | B2 | * | 11/2016 | Rolland | H03K 17/063 |
| 9,577,520 | B2 | * | 2/2017 | Xiu | H02M 1/08 |
| 9,729,150 | B2 | * | 8/2017 | Ishimatsu | H03K 19/0016 |
| 9,806,607 | B2 | * | 10/2017 | Ranmuthu | H02M 3/07 |
| 2018/0004238 | A1 | * | 1/2018 | Shen | H03K 17/063 |

* cited by examiner

*Primary Examiner* — Thomas J. Hiltunen
(74) *Attorney, Agent, or Firm* — Schiff Hardin LLP (57) ABSTRACT

A power stage having a power transistor coupled between a power supply and a switching node; a charge pump coupled between the power supply and a gate of the power transistor; and a gate driver configured to charge the gate of the power transistor until the gate voltage reaches a predefined voltage, and further charge the gate of the power transistor from the charge pump.

19 Claims, 6 Drawing Sheets

Figure 1
Power Supply

POWER STAGE WITH SEQUENTIAL POWER TRANSISTOR GATE CHARGING

TECHNICAL FIELD

This disclosure is related to sequential switching of a power transistor in a power stage with an integrated charge pump.

BACKGROUND

A dual-NMOS power stage uses less power silicon area and provides faster switching than a PMOS power stage. A dual-NMOS power stage with an integrated charge pump has lower implementation cost and increased system reliability as compared with a bootstrap power stage requiring an external capacitor. The accumulation of full gate charge $Q_G$ using a charge pump requires the same power as a bootstrap power stage. This power is $V_{DD}/V_{GS}$-times higher than the power required to accumulate gate charge corresponding to a gate voltage $V_{GS}$ from an ideal voltage source. However, beyond $V_{DD}/V_{GS}$, the implementation of a charge pump exhibits low power efficiency, which makes the gate charge transfer inefficient.

DETAILED DESCRIPTION

The present disclosure is directed to a power stage having an integrated charge pump and a sequential high-side turn-on using more than one voltage domain. A power transistor is switched on by charging its gate sequentially in at least two phases, the second of which involves charging the power transistor gate with the charge pump. The result is decreased high-side switching losses and increased power efficiency.

Figure 1:
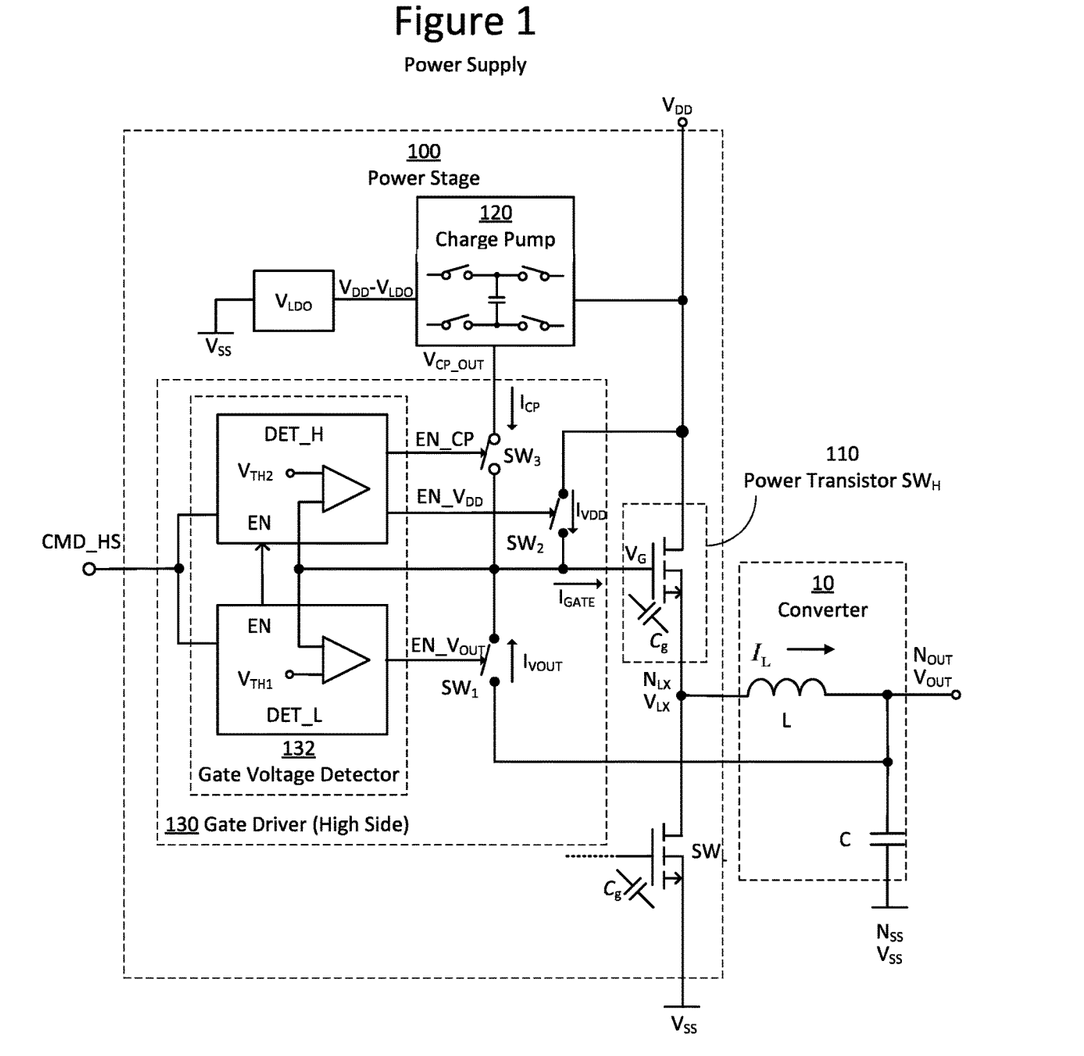
FIG. 1 illustrates a schematic diagram of a power supply comprising a converter and a power stage in accordance with aspects of the disclosure.

FIG. 1 illustrates a schematic diagram of a power supply comprising a converter 10 and a power stage 100 in accordance with aspects of the disclosure. For the sake of clarity, a high-side power transistor switching-off circuit and low side gate driver are not shown.

The converter 10 is a Direct Current-to-Direct Current (DC/DC) converter comprising an inductor L and a capacitor C. The inductor L is coupled between a switching node $N_{LX}$ and an output node $N_{OUT}$. The capacitor C is coupled between the output node $N_{OUT}$ and a source voltage node $N_{SS}$. DC/DC converters are known, and for the sake of brevity, a description of the operation of converter 10 is omitted here.

The power stage 100 comprises a power transistor $SW_H$ 110, an integrated charge pump 120, and a gate driver 130. The power stage 100 is a dual-NMOS power stage, the power transistor $SW_H$ 110 is a high side NMOS transistor, and the gate driver 130 is a high side gate driver.

The power transistor $SW_H$ 110 is coupled between a power supply $V_{DD}$ and the switching node $N_{LX}$.

The charge pump 120 is coupled between the power supply $V_{DD}$ and a gate of the power transistor $SW_H$ 110, and is also coupled between the power supply $V_{DD}$ and an internally generated voltage $V_{DD}$-$V_{LDO}$. The charge pump voltage $V_{CP}$ may be, for example, 2.5V ($V_{CP}$=$V_{CP\_OUT}$-$V_{DD}$=2.5V). The charge pump 120 is configured to generate a positive output voltage $V_{CP\_OUT}$ that is the power supply voltage $V_{DD}$ plus the charge pump voltage $V_{CP}$ (i.e., $V_{CP\_OUT}$=$V_{DD}$+$V_{CP}$). The charge pump output voltage $V_{CP\_OUT}$ is used to turn on the high-side NMOS power transistor $SW_H$ 110.

The gate driver 130 comprises an output node switch $SW_1$, a power supply switch $SW_2$, a charge pump switch $SW_3$, and a gate voltage detector 132. The gate driver 130 is configured to receive a command signal CMD_HS, which may be, for example, a Pulse Width Modulation (PWM) signal.

The output node switch $SW_1$ is coupled between the gate of the power transistor $SW_H$ 110 and the output node $N_{OUT}$. The power supply switch $SW_2$ is coupled between the gate of the power transistor $SW_H$ 110 and the power supply $V_{DD}$. The charge pump switch $SW_3$ is coupled between the gate of the power transistor $SW_H$ 110 and the output of the charge pump 120.

The gate voltage detector 132 comprises a high detector DET_H and a low detector DET_L which are configured to detect the voltage at the gate of the power transistor $SW_H$ 110 to determine when to switch the switches $SW_1$, $SW_2$, $SW_3$. The low detector DET_L is configured to switch the output node switch $SW_1$. The high detector DET_H is configured to switch the power supply switch $SW_2$ and the charge pump switch $SW_3$. The gate detector 132 is ultra-fast, for example, less than 1ns. The low detector DET_L requires a fast comparator with a first threshold voltage $V_{TH1}$ that is referenced to the output voltage $V_{OUT}$. The high detector DET_H requires an ultra-fast comparator with a second threshold voltage $V_{TH2}$ that is referenced to the supply voltage $V_{DD}$. The comparators can monitor the voltage of the power transistor gate, source, or a related voltage, but monitoring the gate is more precise.

Figure 2:
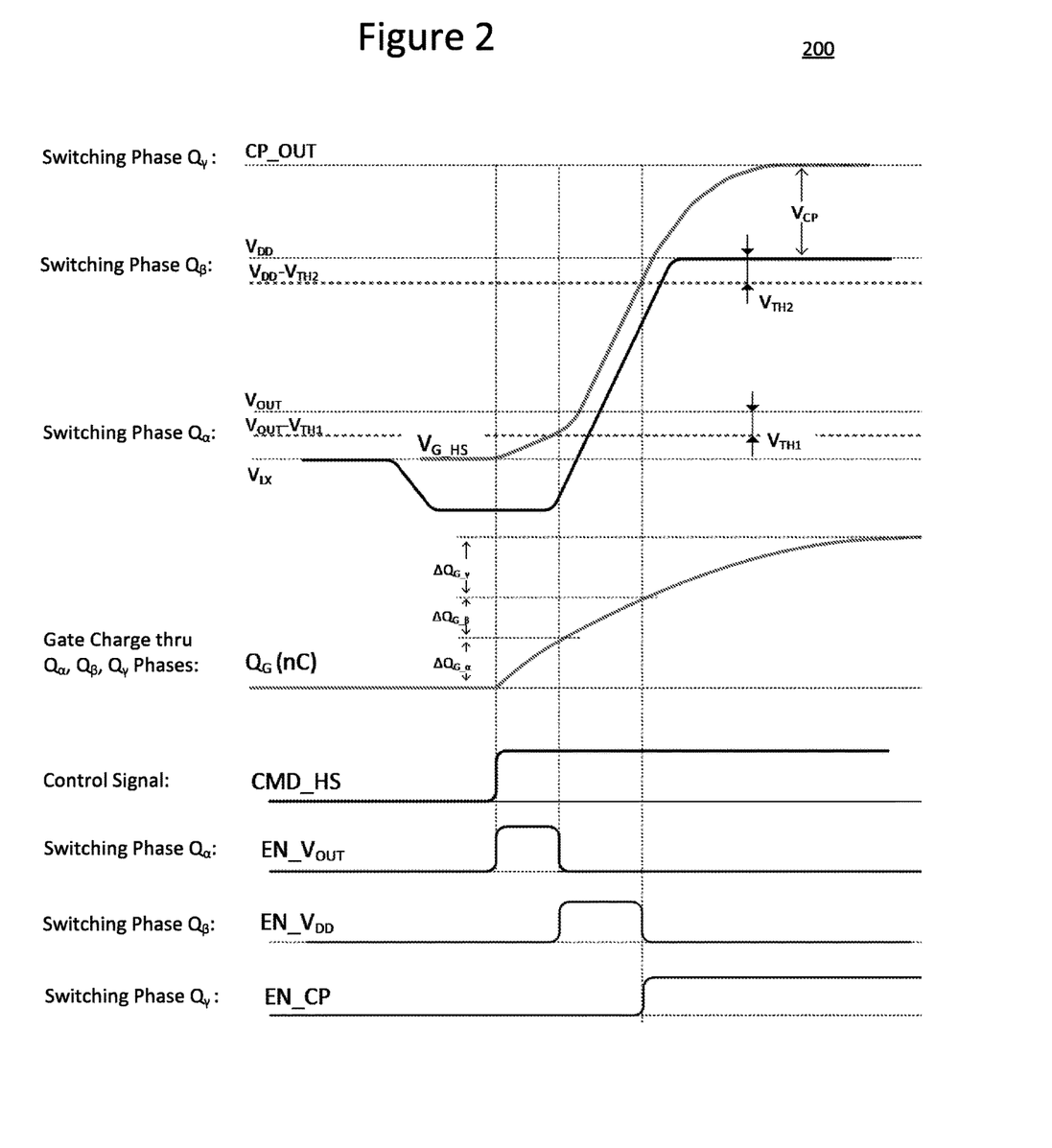
FIG. 2 illustrates signal diagrams of sequential switching phases of the power stage of FIG. 1.

FIG. 2 illustrates signal diagrams 200 of sequential switching phases of the power stage 100 of FIG. 1.

By way of overview, to turn on the power transistor $SW_H$ 110, there are sequential switching phases during which the power transistor gate is charged by being coupled to respective voltage domains:

Switching Phase $Q_\alpha$: output voltage $V_{OUT}$, which is generated by a high-efficiency DC/DC converter 10;

Switching Phase $Q_\beta$: power supply voltage $V_{DD}$; and

Switching Phase $Q_\gamma$: charge pump voltage $V_{CP\_OUT}$, which is generated by a limited-efficiency charge pump 120. There are at least two switching phases, one of which is switching phase $Q\gamma$ using the charge pump voltage $V_{CP\_OUT}$. Alternatively, there may be three switching phases, or even additional switching phases.

The sequential switching and dedicated high-performance detectors (low detector DET_L and high detector DET_H)

lower the power required to turn on the power transistor $SW_H$ 110. There is faster settling of the power transistor gate voltage $V_G$. Also, the rising speed of the switching node $N_{LX}$ is increased, and as a consequence, the transition speed of the switching node $N_{LX}$ is reduced, resulting in better power efficiency in a high-current scenario.

Switching Phase Qα: Charge Power Transistor Gate with Output Voltage $V_{OUT}$

During the switching phase $Q_\alpha$, the gate driver 130 is configured to charge, as an initial charge in this example, the gate of the power transistor $SW_H$ 110 with an output voltage $V_{OUT}$ of the converter 10 until the gate voltage $V_G$ reaches the output voltage $V_{OUT}$ minus a first threshold voltage $V_{TH1}$.

More specifically, the on-phase of the power transistor $SW_H$ 110 may begin when control signal CMD_HS goes high. In response to receiving a high command signal CMD_HS, the low detector DET_L of the gate voltage detector 132 is configured to transmit signal EN_$V_{OUT}$ to close the output node switch $SW_1$ to connect the output node $N_{OUT}$ with the gate of the power transistor $SW_H$ 110. The power to the gate capacitor $C_g$ is delivered from the output voltage $V_{OUT}$, obtained by the high-efficiency DC/DC convertor 10. The output voltage $V_{OUT}$ is applied via the output node switch $SW_1$ until the gate voltage $V_G$ reaches the output voltage $V_{OUT}$ minus the first threshold voltage $V_{TH1}$. Typically, this time corresponds with the beginning of Miller plateau of the power transistor $SW_H$ 110.

The power required for this switching phase $Q_a$ can be estimated as:

$$P_{HS\_VOUT} = V_{OUT} \cdot \Delta Q_{G\_\alpha} \cdot f_{SW} \quad \text{(Equation 1)}$$

where the power efficiency of the convertor 10 is assumed to be 1, fsw is the clock switching frequency, and the output voltage $V_{OUT}$ has a low value, e.g., 2.5V. This Equation 1 indicates that the switching phase Qα portion of the gate charge is delivered with high efficiency.

Switching Phase $Q_\beta$: Charge Power Transistor Gate with Power Supply Voltage $V_{DD}$ During the switching phase $Q_\beta$, the gate driver 130 is configured to charge from the power supply $V_{DD}$, the gate of the power transistor $SW_H$ 110 until the gate voltage $V_G$ reaches a predefined voltage. The predefined voltage is equal to a voltage of the power supply $V_{DD}$ minus a second threshold voltage $V_{TH2}$.

More specifically, when the low detector DET_L detects that the gate voltage $V_G$ reaches the predefined voltage, that is, the output voltage $V_{OUT}$ minus the first threshold voltage $V_{TH1}$ in the $Q_\alpha$ phase discussed above, the output node switch $SW_1$ is turned off to disconnect the output node $N_{OUT}$ (output voltage $V_{OUT}$) from the gate of the power transistor $SW_H$ 110. The low detector DET_L then hands control to the high detector DET_H by transmitting an enable signal EN. The gate voltage detector 132 is then configured to transmit signal EN_$V_{DD}$ to immediately turn on the power supply switch $SW_2$ to connect the power supply $V_{DD}$ with the gate of the power transistor $SW_H$ 110. The power supply switch $SW_2$ remains active until the gate voltage $V_G$ of the power transistor $SW_H$ 110 reaches a predefined voltage, that is, the supply voltage $V_{DD}$ minus the second threshold voltage $V_{TH2}$.

During this switching phase $Q_\beta$, the power to the gate is delivered directly from power supply $V_{DD}$, which allows the charge pump 120 to have no load and thus be fully pre-charged for the beginning of the switching phase $Q_\gamma$. The power required from the power supply $V_{DD}$ can be estimated as:

$$P_{HS\_VDD} = V_{DD} \cdot \Delta Q_{G\_\beta} \cdot f_{SW} \quad \text{(Equation 2)}$$

Advantageously, this power $P_{HS\_VDD}$ is not affected by the low efficiency of the charge pump 120. This switching phase $Q_\beta$ results in faster charging because the supply voltage $V_{DD}$ has a large current $I_{VDD}$, and is responsible for the rising time of the switching node $N_{LX}$.

Switching Phase Qγ: Charge Power Transistor Gate with Charge Pump Voltage $V_{CP\_OUT}$ During the switching phase $Q_\gamma$, the gate driver 130 is configured to further charge the gate of the power transistor $SW_H$ 110 from the charge pump 120 until the power transistor $SW_H$ 110 reaches a low on resistance.

More specifically, in response to detecting that the gate voltage $V_G$ reaches the voltage of the power supply $V_{DD}$ minus the second threshold voltage $V_{TH2}$ in the switching phase $Q_\beta$ discussed above, switching phase Q, begins. The gate voltage detector 132 opens the power supply switch $SW_2$, and transmits signal EN_CP to close the charge pump switch $SW_3$, thereby disconnecting the power supply $V_{DD}$ from the gate of the power transistor $SW_H$ 110, and connecting the charge pump 120 with the gate of the power transistor $SW_H$ 110. The charge pump output voltage $V_{CP\_OUT}$ is connected to the gate of the power transistor $SW_H$ 110, and the gate voltage $V_G$ rises to the charge pump output voltage $V_{CP\_OUT}$, which is the supply voltage $V_{DD}$ plus the charge pump voltage $V_{CP}$ ($V_{CP\_OUT}=V_{DD}+V_{CP}$). The charge pump switch $SW_3$ remains closed, but then is opened when the control signal CMD_HS goes low.

The power required form the supply voltage $V_{DD}$ can be estimated to:

$$P_{HS\_VDD} = \frac{V_{DD} \Delta Q_{G\_\gamma} f_{SW}}{\eta_{CP}}. \quad \text{(Equation 3)}$$

The charge pump 120 is fully exploited until the end of the charging cycle when the clock frequency can be reduced. Since only a portion of the power of the transistor gate charge is coming from the charge pump 120, the design of the charge pump 120 can be relaxed, that is, its high-frequency switching power can be reduced.

Figure 3:
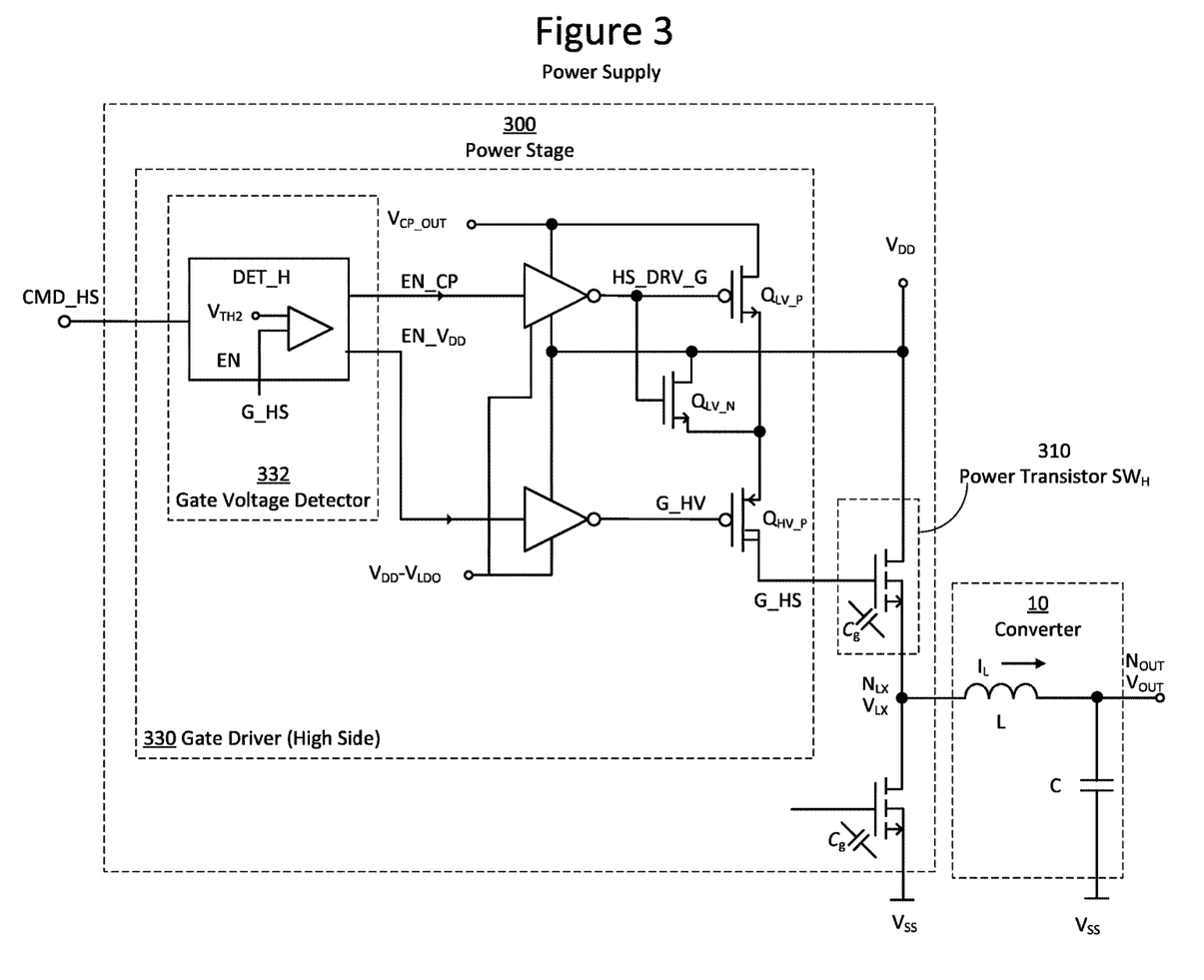
FIG. 3 illustrates a schematic diagram of an exemplary implementation of a power supply comprising a converter and a power stage with a two-phase gate driver in accordance with aspects of the disclosure

FIG. 3 illustrates a schematic diagram of an exemplary implementation of a power supply comprising a converter 10 and a power stage 300 with a two-phase gate driver 330 in accordance with aspects of the disclosure.

The power stage 300 comprises low-voltage transistors $Q_{LV\_P}$ and $Q_{LV\_N}$, which are used efficiently (e.g., $V_{GS\_max}=V_{CP}$). The power stage 300 also comprises a high-voltage transistor $Q_{HV\_P}$, and the gate voltage of G_HS is connected to the driver via high-voltage transistor $Q_{HV\_P}$.

Figure 4A:
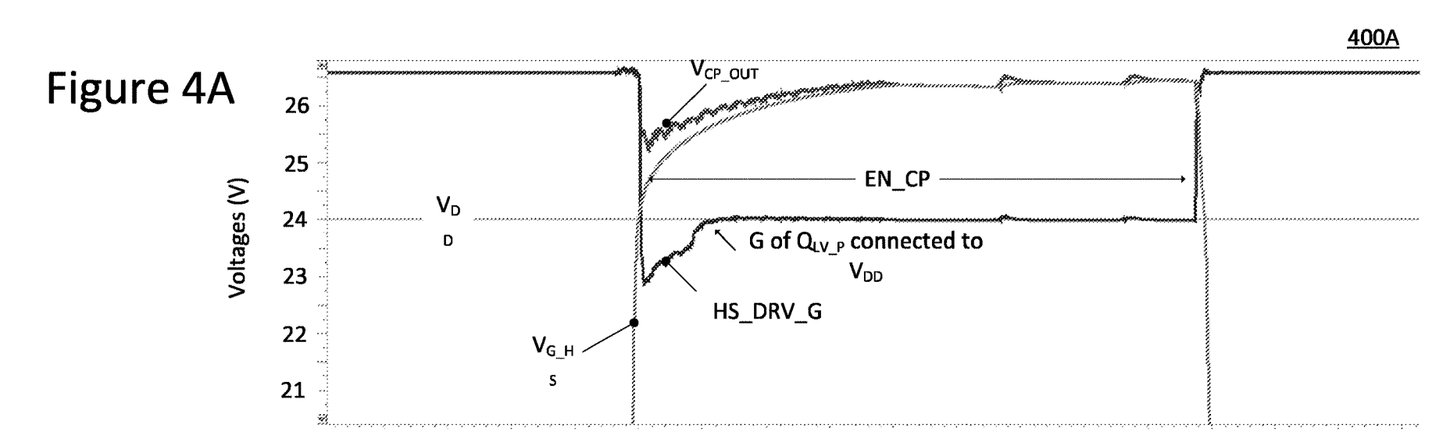
FIGS. 4A and 4B illustrate signal diagrams related to the exemplary implementation of FIG. 3.
Figure 4B:
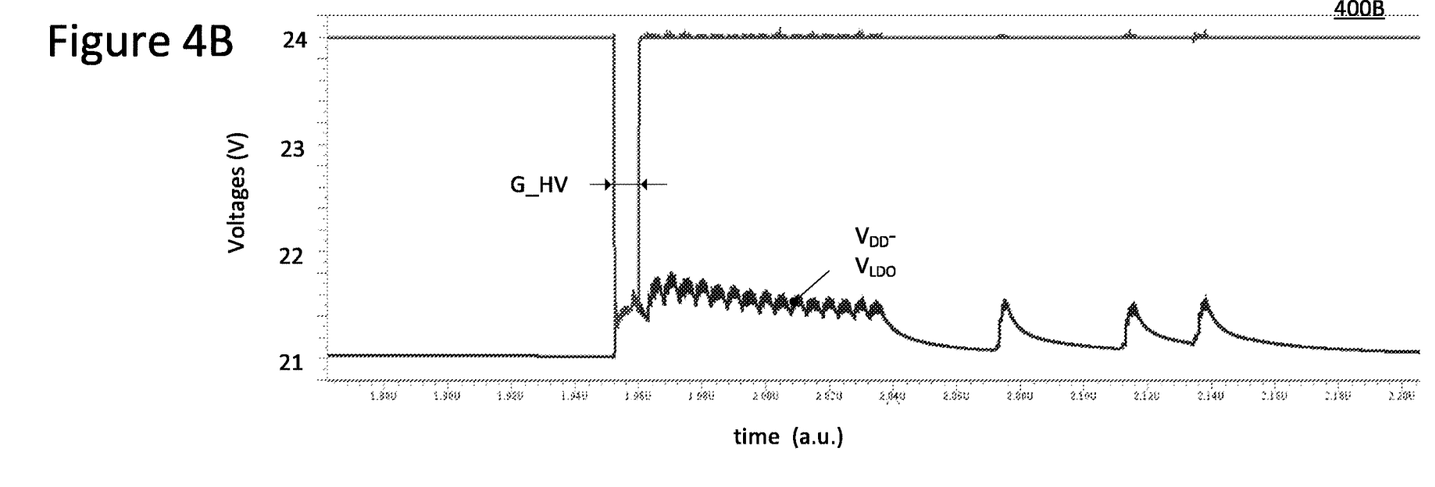

The power stage 300 operation is described with reference to FIGS. 4A and 4B illustrating signal diagrams 400A and 400B, respectively.

While high-side gate driver 330 is activated, the gate voltage G_HV is set to the power supply voltage $V_{DD}$ minus an internally generated voltage $V_{LDO}$ (e.g., 24V−2.5V=21.5V). The voltage HS_DRV_G is set to the charge pump output voltage $V_{CP\_OUT}$. This means that the high-voltage transistor $Q_{HV\_P}$ and the low-voltage transistor $Q_{LV\_N}$ are turned on and the source of high-voltage transistor $Q_{HV\_P}$ is connected to the power supply $V_{DD}$.

The gate voltage G_HS increases until reaching the detector threshold (i.e., $V_{DD}-V_{TH2}$). At this time, voltage HS_DRV_G is pulled below $V_{DD}$ for a short period of time (e.g., 2 ns), while the gate voltage G_HV remains low. This permits full enablement of low voltage transistor $Q_{LV\_P}$ even if the charge pump output voltage $V_{CP\_OUT}$ suddenly decreases because off the large pulsed current. Here, the high value of the power NMOS gate capacitor $C_g$ acts as a buffer and keeps the gate voltage G_HS constant. After this short strobing pulse, the gate of the low-voltage transistor $Q_{LV\_P}$ is connected to the power supply $V_{DD}$, and the charge pump continues increasing its output voltage $V_{CP\_OUT}$ towards the final value. Thus the gate voltage G_HS has a fast rise towards its final value of power supply voltage $V_{DD}$ plus the charge pump voltage $V_{CP}$, allowing a fast rising time of the switching node $N_{LX}$ in comparison with a more expensive bootstrap gate driver.

Figure 5:
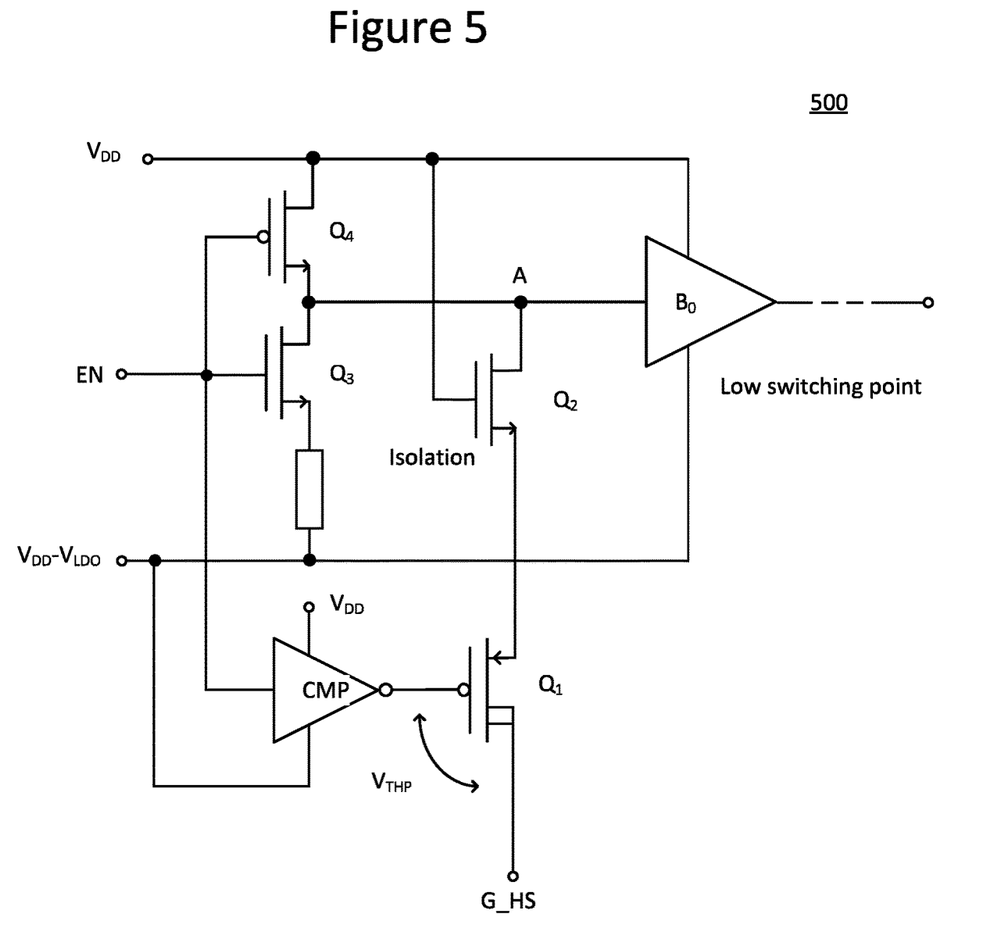
FIG. 5 illustrates a schematic diagram of an implementation of a comparator in the high detector of the power stage of FIG. 1.

FIG. 5 illustrates a schematic diagram of an implementation of a comparator in the high detector DET_H of the power stage 100 of FIG. 1.

In order to provide smooth switching between the power supply switch $SW_2$ and the charge pump switch $SW_3$, the high-side gate voltage detector 132 detects with high speed, typically less than 1ns. In the example shown in FIG. 5, a high-voltage transistor $Q_1$ is connected to the high-side power transistor gate G_HS.

While the enable signal EN is high, the gate of the high-voltage transistor $Q_1$ is set to the power supply voltage $V_{DD}$ minus an internally generated voltage $V_{LDO}$ ($V_{DD}$–$V_{LDO}$), and node A is tied to the identical voltage via transistor $Q_3$. In order to activate the comparator CMP, a current raises the voltage at node A to the switching point of the output buffer $B_0$. This happens when the gate voltage G_HS exceeds the power supply voltage $V_{DD}$ minus the internally generated voltage $V_{LDO}$ ($V_{DD}$–$V_{LDO}$) by more than a threshold voltage $V_{THP}$ of transistor Q1. At this point, transistor Q1 turns on and increases the voltage at node A.

The comparator CMP is then disabled, which brings the gate to the power supply voltage $V_{DD}$. This protects the gate source voltage $V_{GS}$ of $Q_1$ against oxide breakdown. When the gate voltage G_HS exceeds the power supply voltage $V_{DD}$, with the assistance of the charge pump, transistor $Q_1$ is turned on. This can be dangerous for the gates of transistors connected to the node A. Therefore, isolation transistor $Q_2$ is added. Transistor $Q_2$ turns off when the gate voltage G_HS approaches the power supply voltage $V_{DD}$.

The high detector DET_H uses a single transistor to detect the high-side detector threshold $V_{TH2}$. Aside from its fast response, this detector DET_H is advantageous in its simple implementation with zero bias current. Generation of the signal is essential for sequential switching. This permits optimal timing of the high-side NMOS gate voltage switches, and thus results in a smooth and fast rise to the final charge pump output voltage $V_{CP\_OUT}$.

Figure 6:
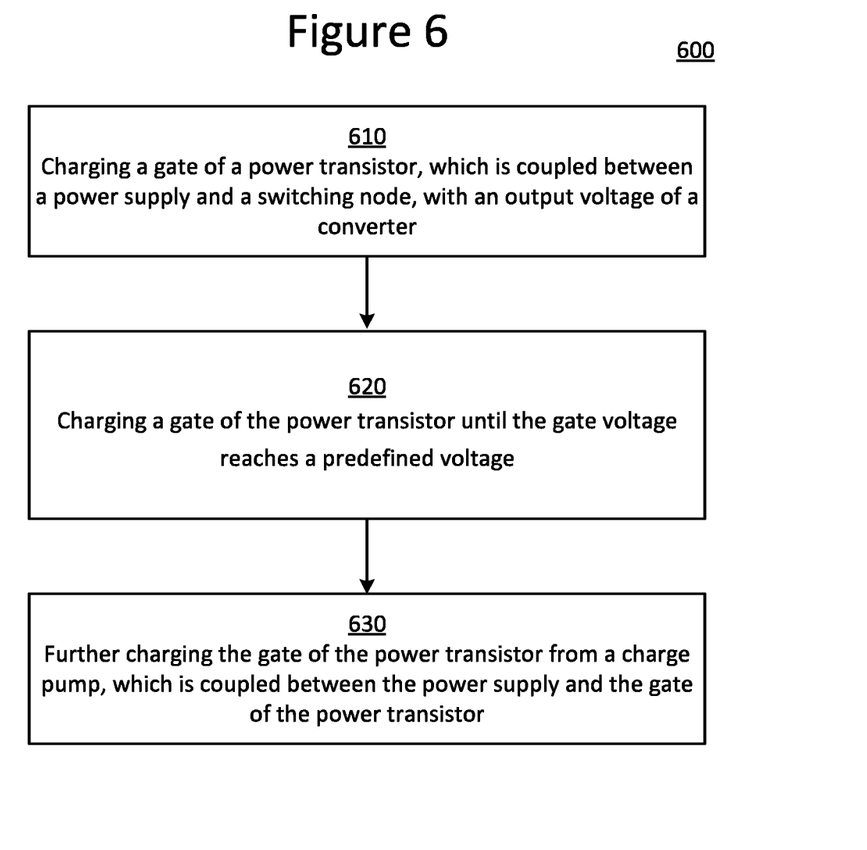
FIG. 6 illustrates a flowchart of a method of charging a power transistor in a power stage in accordance with aspects of the disclosure.

FIG. 6 illustrates a flowchart 600 of a method of charging a power transistor $SW_H$ 110 in a power stage 100 in accordance with aspects of the disclosure.

In Step 610, a gate of the power transistor $SW_H$ 110, which is coupled between a power supply $V_{DD}$ and a switching node $N_{LX}$, is charged with an output voltage $V_{OUT}$ of a converter 10.

In Step 620, the gate of the power transistor $SW_H$ 110 is charged until the gate voltage reaches a predefined voltage.

In Step 630, the gate of the power transistor $SW_H$ 110 if further charged from a charge pump 120, which is coupled between the power supply $V_{DD}$ and the gate of the power transistor $SW_H$ 110.

As discussed above, there are at least two switching phases, one of which is the phase using the charge pump voltage $V_{CP\_OUT}$ in Step 630. Alternatively, there may be three switching phases, or even additional switching phases.

The dual-NMOS power stage 100 described herein is an improvement over a bootstrap power stage, which requires an external bootstrap capacitor, an extra pin on a chip, and associated Printed Circuit Board (PCB) routing. These elements of the bootstrap power stage require additional cost and circuit area. The dual-NMOS power stage 100 therefore results in a significant cost reduction.

The sequential phase switching described herein efficiently uses voltages already available in the dual-NMOS power stage 100. As a result, there is a considerable decrease (e.g., >50%) in high-side power transistor switching losses. There is also a faster settling of the high-side power transistor gate voltage $V_G$ due to the charge pump 120 settling to the steady state output voltage at the beginning of the charge pump voltage $V_{CP\_OUT}$ switching phase Qγ. Slow settling of the gate voltage $V_G$ is one of the reasons the charge pump concept had not been adopted previously.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A power stage, comprising:
    a power transistor coupled between a power supply and a switching node;
    a charge pump coupled between the power supply and a gate of the power transistor; and
    a gate driver configured to:
        charge, as an initial charge, the gate of the power transistor with an output voltage of a converter in response to a control signal and until the gate voltage reaches the output voltage minus a threshold voltage;
        charge the gate of the power transistor until the gate voltage reaches a predefined voltage; and
        further charge the gate of the power transistor from the charge pump.

2. The power stage of claim 1, wherein the gate driver is further configured to:
    charge the gate of the power transistor from the charge pump until the power transistor reaches a low on resistance.

3. The power stage of claim 1, wherein the gate driver is configured to charge the gate of the power transistor until the gate voltage reaches the predefined voltage, from the power supply.

4. The power stage of claim 3, wherein the predefined voltage is equal to a voltage of the power supply minus the threshold voltage.

5. The power stage of claim 3, wherein the converter is coupled to the switching node.

6. The power stage of claim 3, wherein the gate driver comprises:
    a power supply switch coupled between the gate of the power transistor and the power supply;
    a charge pump switch coupled between the gate of the power transistor and the charge pump; and
    a gate voltage detector configured to:

close the power supply switch to connect the power supply with the gate of the power transistor; and open the power supply switch and close the charge pump switch, in response to detecting that the gate voltage reaches the voltage of the power supply minus a threshold voltage, to disconnect the power supply from and connect the charge pump with the gate of the power transistor.

7. The power stage of claim 1, wherein the gate driver is further configured to:

while charging the gate of the power transistor until the gate voltage reaches the predefined voltage, charge the charge pump.

8. The power stage of claim 1, wherein the converter is coupled to the switching node.

9. The power stage of claim 1 being a dual-NMOS power stage, and wherein the power transistor is a high side NMOS transistor and the gate driver is a high side gate driver.

10. A power stage comprising:

a power transistor coupled between a power supply and a switching node;

a charge pump coupled between the power supply and a gate of the power transistor; and a gate driver configured to:
charge, as an initial charge, the gate of the power transistor with an output voltage of a converter;
charge the gate of the power transistor until the gate voltage reaches a predefined voltage from the power supply; and
further charge the gate of the power transistor from the charge pump, wherein the gate driver comprises:
an output node switch coupled between the gate of the power transistor and an output node;
a power supply switch coupled between the gate of the power transistor and the power supply;
a charge pump switch coupled between the gate of the power transistor and the charge pump; and
gate voltage detector configured to:
close the output node switch, in response to receiving a command signal, to connect the output node with the gate of the power transistor;
open the output node switch and close the power supply switch, in response to detecting that the gate voltage reaches the output voltage minus a first threshold voltage, to disconnect the output node from and connect the power supply with the gate of the power transistor; and
open the power supply switch and close the charge pump switch, in response to detecting that the gate voltage reaches the predefined voltage, which is the voltage of the power supply minus a second threshold voltage, to disconnect the power supply from and connect the charge pump with the gate of the power transistor.

11. A method of charging a power transistor in a power stage, the method comprising:

charging, as an initial charge and in response to a control signal, the gate of the power transistor with an output voltage generated by a converter coupled to the switching node until the gate voltage reaches the output voltage minus a threshold voltage;

charging a gate of the power transistor, which is coupled between a power supply and a switching node, until the gate voltage reaches a predefined voltage; and further charging the gate of the power transistor from a charge pump, which is coupled between the power supply and the gate of the power transistor.

12. The method of claim 11, wherein the gate of the power transistor is charged from the charge pump until the power transistor reaches a low on resistance.

13. The method of claim 11, wherein the charging the gate of the power transistor until the gate voltage reaches the predefined voltage comprises:

charging the gate of the power transistor from the power supply.

14. The method of claim 1, wherein the predefined voltage is equal to a voltage of the power supply minus the threshold voltage.

15. The method of claim 13, wherein the converter is coupled to the switching node.

16. The method of claim 13, further comprising:

closing a power supply switch to connect the power supply with the gate of the power transistor; and opening the power supply switch and closing a charge pump switch, in response to detecting that the gate voltage reaches the voltage of the power supply minus a threshold voltage, to disconnect the power supply from and connect the charge pump with gate of the power transistor.

17. The method of claim 13, further comprising:

while charging the gate of the power transistor until the gate voltage reaches the predefined voltage, charging the charge pump.

18. The method of claim 11, wherein the power stage is a dual-NMOS power stage, the power transistor is a high side NMOS transistor, and the gate driver is a high.

19. A method of charging a power transistor in a power stage, the comprising:

closing an output node switch, in response to receiving a command signal, to connect the gate of the power transistor with an output node;

charging, as an initial charge, the gate of the power transistor with an output voltage at the output node of a converter;

opening the output node switch and closing a power supply switch, in response to detecting that the gate voltage reaches the output voltage minus a first threshold voltage, to disconnect the output node from and connect a power supply with the gate of the power transistor;

charging the gate of the power transistor, which is coupled between the power supply and a switching node, from the power supply until the gate voltage reaches a predefined voltage; and opening the power supply switch and closing a charge pump switch, in response to detecting that the gate voltage reaches the voltage of the predefined voltage, which is the power supply minus a second threshold voltage, to disconnect the power supply from and connect a charge pump with gate of the power transistor; and further charging the gate of the power transistor from the charge pump, which is coupled between the power supply and the gate of the power transistor.

* * * * *